United States Patent
Su (10) Patent No.: US 8,288,935 B2
(45) Date of Patent: Oct. 16, 2012

(54) LIGHT EMITTING DIODE APPARATUS AND MANUFACTURING METHOD THEREOF

(75) Inventor: Hwa Su, Taipei (TW)

(73) Assignee: Intematix Technology Center Corp., Taoyuan County (TW)

( * ) Notice: Subject to any disclaimer, the term of this patent is extended or adjusted under 35 U.S.C. 154(b) by 196 days.

(21) Appl. No.: 12/899,831

(22) Filed: Oct. 7, 2010

(65) Prior Publication Data

US 2011/0089810 A1 Apr. 21, 2011

Related U.S. Application Data

(60) Provisional application No. 61/251,741, filed on Oct. 15, 2009.

(51) Int. Cl.
 *H01L 33/00* (2010.01)
(52) U.S. Cl. ............................ 313/498; 257/90; 313/499
(58) Field of Classification Search .............. 257/88–90, 257/100; 313/498, 499; 362/230, 231, 249.02
See application file for complete search history.

(56) References Cited

U.S. PATENT DOCUMENTS

| | | | | |
|---|---|---|---|---|
| 5,793,061 A | * | 8/1998 | Ohuchi et al. | 257/96 |
| 6,957,899 B2 | | 10/2005 | Jiang et al. | |
| 2002/0070681 A1 | * | 6/2002 | Shimizu et al. | 315/246 |
| 2007/0284994 A1 | * | 12/2007 | Morimoto et al. | 313/483 |
| 2008/0111123 A1 | * | 5/2008 | Tu et al. | 257/13 |
| 2008/0218098 A1 | | 9/2008 | Lee et al. | |
| 2009/0109151 A1 | | 4/2009 | Kim et al. | |
| 2010/0051976 A1 | * | 3/2010 | Rooymans | 257/89 |

FOREIGN PATENT DOCUMENTS

TW 200826320 12/1995

* cited by examiner

*Primary Examiner* — Nimeshkumar Patel
*Assistant Examiner* — Steven Horikoshi
(74) *Attorney, Agent, or Firm* — Chun-Ming Shih; HDLS IPR Services (57) ABSTRACT

The present invention discloses a light emitting diode apparatus and a manufacturing method thereof, and more particularly to provide an AC-driven white light emitting diode apparatus comprising a plurality of groups of the AC-driven light emitting diode chips with different emission wavelengths and a plurality of groups of the DC-driven light emitting diode chips with different emission wavelengths. The AC-driven white light emitting diode apparatus manufactured by the disclosed method has the properties of high color rendering, high light emitting efficiency, and stable chromaticity coordinate.

17 Claims, 12 Drawing Sheets

LIGHT EMITTING DIODE APPARATUS AND MANUFACTURING METHOD THEREOF

BACKGROUND OF THE INVENTION

1. Field of the Invention

The present invention is related to a light emitting diode (LED) apparatus and a manufacturing method thereof, and more particularly to an alternating current driven (AC-driven) white LED apparatus manufacturing method, and an AC-driven white LED apparatus capable of achieving a high color rendering, a high light emitting efficiency and a stable chromaticity coordinate.

2. Description of the Related Arts

Figure 1:
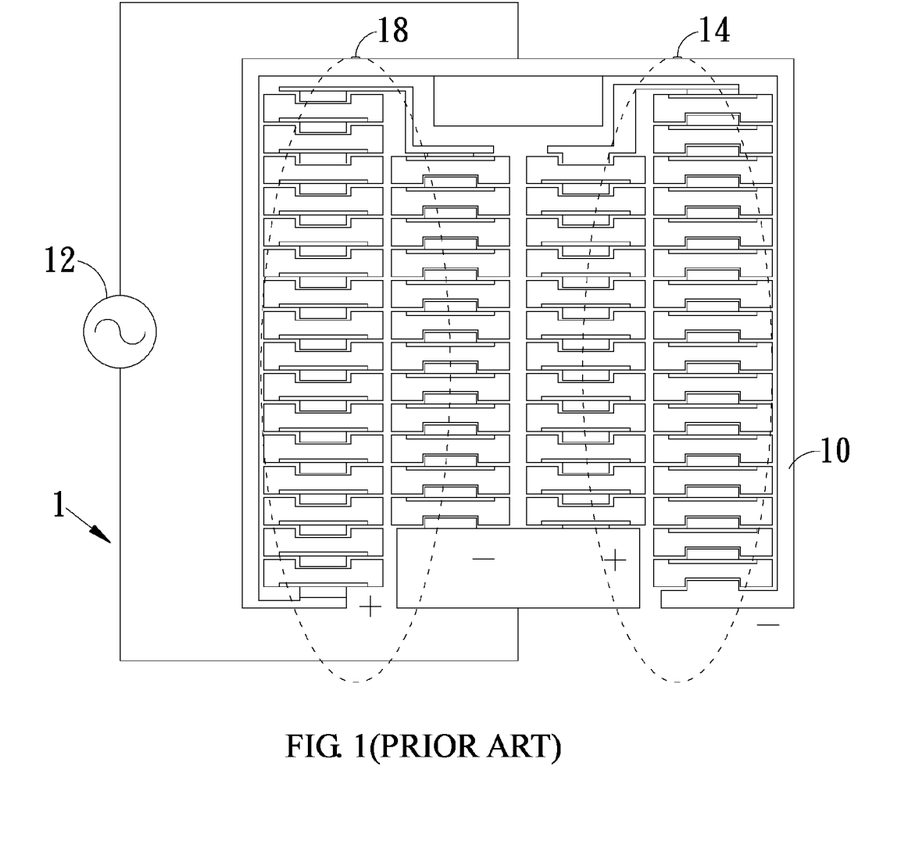
FIG. 1 is a schematic view showing a conventional LED array structure.

With reference to FIG. 1 for a schematic view of a LED array as disclosed in U.S. Pat. No. 6,957,899, the LED array 1 comprises an AC power supply 12, a first LED array 14 and a second LED array 18. In FIG. 1, the first LED array 14 and the second LED array 18 are composed of a plurality of micro-LED chips connected in series with each other and arranged on a same plane 10. An AC voltage with a positive half wave period is applied to drive the first LED array 14 to emit light, and an AC voltage with a negative half wave period is applied to drive the second LED array 18 to emit light, respectively. In general, the utility power of each different country has an AC frequency with 50~60 Hz which is greater than the frequency required for the duration of vision of human beings, so that we cannot visually distinguish the alternating light emissions of the first and second LED arrays 14, 18 in the LED array 1, thereby achieving the objective of AC-driven applications.

At present, the yield rate of the GaN-based LED chips is unable to provide a uniform brightness or a 100% light emitting efficiency of each micro-LED chip. therefore if an AC voltage is applied to drive the first LED array 14 to emit light, as we know, light and heat will be generated. Therefore, the temperature and voltage will be deviated easily to cause a non-uniform light emission. Furthermore, if an additional AC voltage of the power supply 12 produces a pluse onto the light emitting device, the LED chip in the light emitting device may be broken easily, hence, the reliability will become a big issue as well as a major drawback of the disclosed LED array in this invention.

Figure 2:
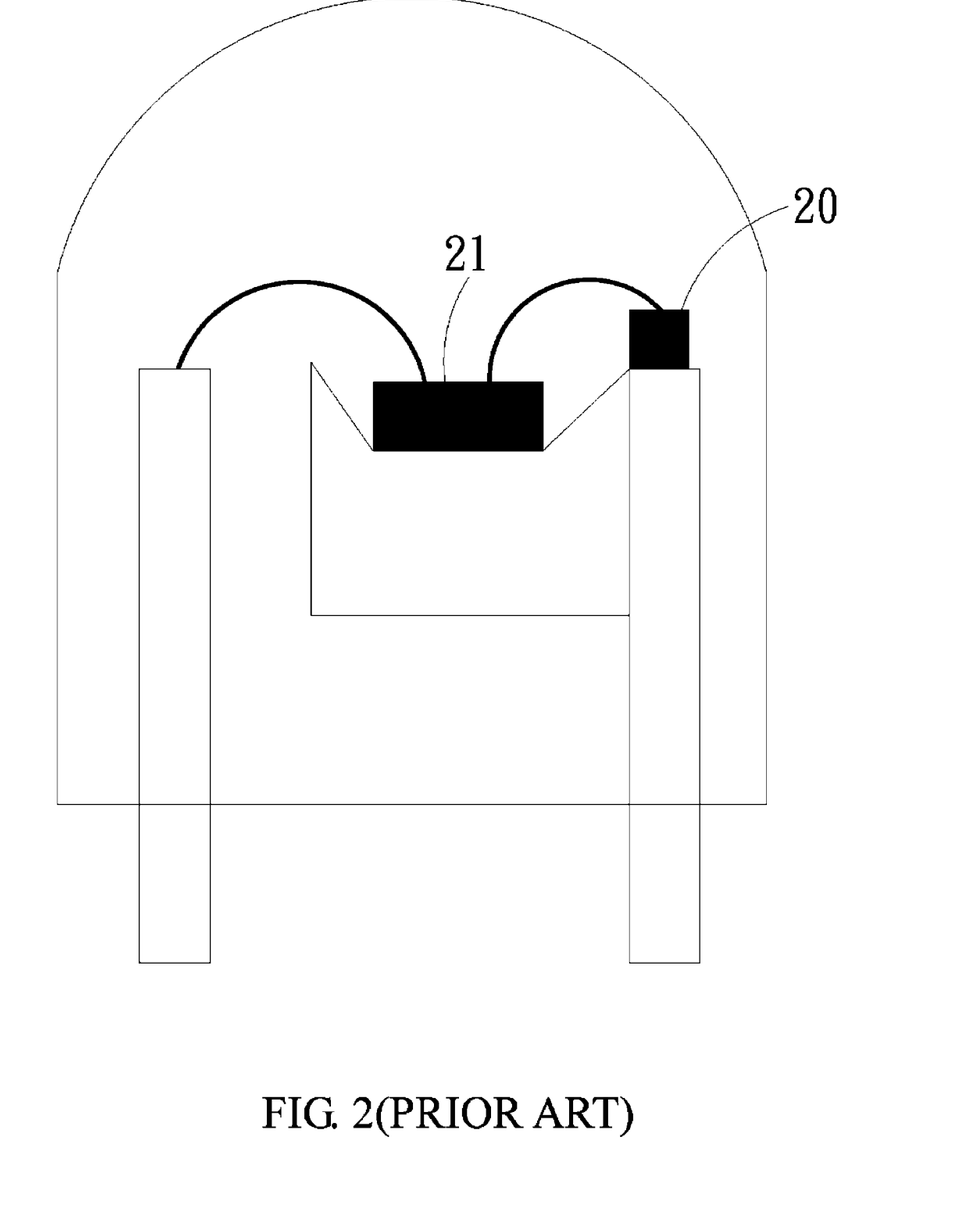
FIG. 2 is a schematic view showing a conventional light emitting apparatus structure.

To overcome the aforementioned drawback of the GaN LED array disclosed in U.S. Pat. No. 6,957,899, a light emitting device as shown in FIG. 2 is disclosed in TW Pat. Publication No. 200826320, wherein the light emitting device comprises at least one correction circuit 20 to serve as a temperature and voltage compensation circuit provided for the operation of an AC-driven LED component 21 and achieve the effect of absorbing pluses. However, the aforementioned invention still has a drawback of failing to compensate the color rendering during light emitting.

Figure 3:
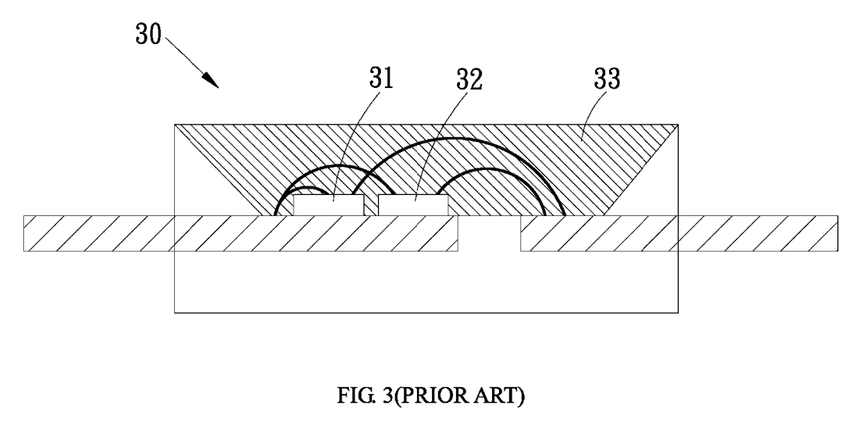
FIG. 3 is a schematic view showing another conventional light emitting apparatus structure.

With reference to FIG. 3 for a schematic view of a LED device disclosed in U.S. Application Publication No. 20090109151, wherein the white light emitting apparatus 30 is composed of two groups of the AC-driven LED 31 and 32, with different emission wavelengths from each other, and a phosphor material 33 to improve the color rendering. One of the methods is to provide an AC-driven blue-emitting LED and an AC-driven green-emitting LED, and a red-emitting phosphor is encapsulated on the AC-driven blue-emitting LED. Another method is to provide an AC-driven blue-emitting LED and an AC-driven red-emitting LED, and a phosphor is encapsulated on the AC-driven blue-emitting LED. The phosphor can absorb a part of the radiation emission from the blue-emitting LED and itself emit in spectral regions ranging from blue to red. Although, the prior art discloses the methods to improve the color rendering of white LED, yet the transfer efficiency of red-emitting phosphor, in the spectral region ranging from 600 to 630 nm, is not satisfactory even though the manufacturing technology is very mature. Hence, the first method can improve the color rendering, but it is hard to effectively enhance the light emitting efficiency of the light emitting apparatus. Moreover, the second method has the potential to improve the color rendering and avoid the decrease of light emitting efficiency. It is noteworthy that, if the group of the AC-driven red-emitting LED is made by the AlInGaP-based compound semiconductors, it will cause a worse stability in an operation ambiance of higher temperature due to the energy band gap of the AlInGaP is easy to shrink when the ambient temperature increases. In other words, it is hard to control the chromaticity coordinate of the white LED due to the large drift of the emission wavelength. Hence, the method still has the drawback in practical application.

Figure 4:
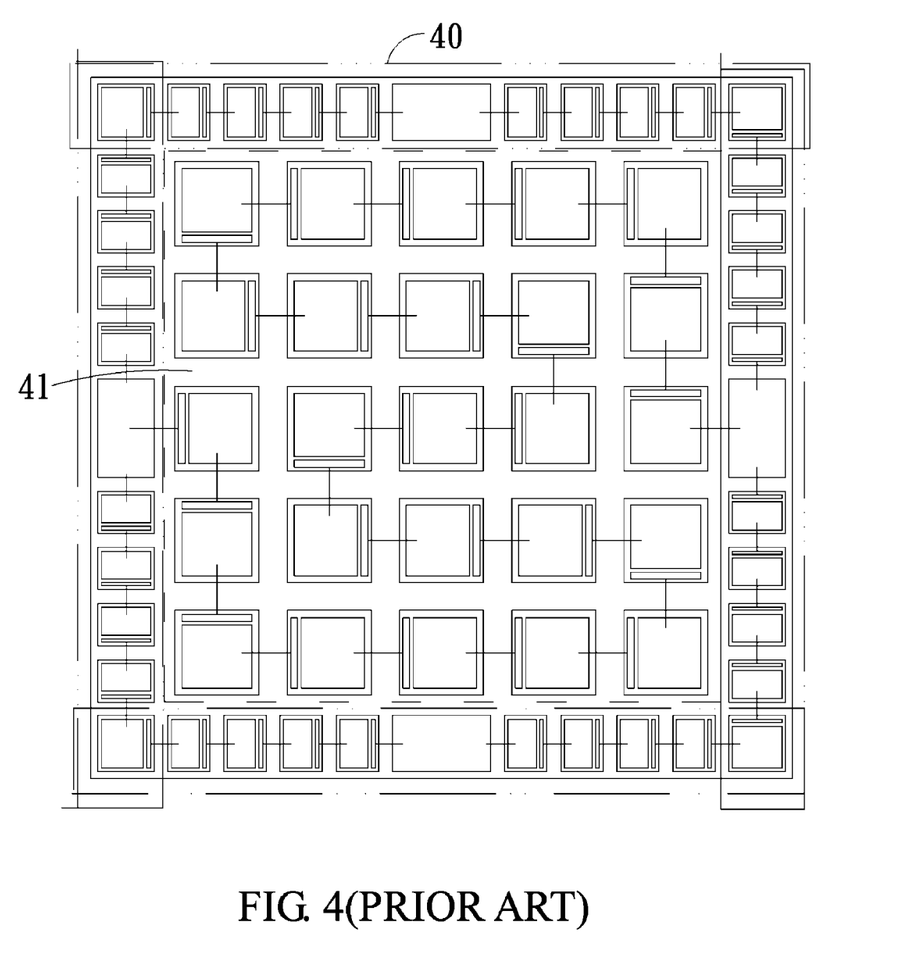
FIG. 4 is a schematic view showing another conventional light emitting device structure.

With reference to FIG. 4 for a schematic view of a LED device disclosed in U.S. Publication No. 20080218098, a bridge rectifying circuit 40 composed of another set of LEDs is added to improve the reliability of operating an AC-driven LED device and protect a LED array 41. However, the bridge rectifying circuit 40 is directly formed on a substrate used by the LED array 41 and disposed at an external edge. In other words, the LED array 41 and the bridge rectifying circuit 40 are produced in a same fabrication process, and the bridge rectifying circuit 40 not only provides an AC-to-DC conversion function, but also has the function of emitting light. However, this method is unable to produce a high emitting efficiency LED assembly with different light emission wavelengths on the same substrate by the epitaxial and chip fabrication process, thus, the method still has the drawback of failing to provide the effect of compensating the color rendering.

In view of the aforementioned shortcomings of the prior arts, the inventors of the present invention based on years of experience in the related industry to conduct extensive researches and experiments, and finally developed a light emitting device according to the present invention to overcome the shortcomings of the prior arts.

SUMMARY OF THE INVENTION

Therefore, the primary purpose of the present invention is to provide a LED apparatus having the properties of high color rendering, high light emitting efficiency and stable chromaticity coordinate.

In accordance with the objective of the present invention, a LED apparatus is provided. The LED apparatus comprises a lead frame, at least one group of AC-driven micro-LED chips, at least one group of DC-driven LED chips, and at least one wavelength conversion phosphor material for absorbing radiation emission of the chips. The group of the AC-driven micro-LED chips and the group of the DC-driven LED chips are individually mounted onto the lead frame and connected by a conductive wire to form the LED apparatus capable of being driven by AC power source, the wavelength conversion phosphor material absorbs a part of the radiation emission of the chips thereby converting a spectral region thereof to have a different peak wavelength.

In addition, a LED apparatus is further provided, The LED apparatus comprises a lead frame, at least one group of AlInGaN-based LED chips, at least one group of InGaPN-based LED chips, and at least one wavelength conversion phosphor material disposing on the at least one group of AlInGaN-based LED chips for absorbing radiation emission therefrom. The group of the AlInGaN-based LED chips and the group of the InGaPN-based LED chips are individually mounted onto the lead frame and connected by a conductive wire to form the LED apparatus capable of being driven by AC power source, the wavelength conversion phosphor material absorbs a part of the radiation emission from the groups of the AlInGaN-based LED chips thereby converting a spectral region thereof to have a different peak wavelength.

Further, a method for manufacturing the LED apparatus is also provided. The method for manufacturing the LED apparatus includes the steps of: providing a lead frame; mounting at least one group of AC-driven micro-LED chips and at least one group of DC-driven LED chips on the lead frame; electrically connecting the groups of the AC-driven micro-LED chips and the DC-driven LED chips; and providing a mixed resin comprising at least one phosphor formed over the groups of LED chips.

In view of above, the LED apparatus and manufacturing method thereof according to the present invention have the advantages are as follows:

(1) The LED apparatus is composed of one group of AC-driven micro-LED chips, one group of cascading DC-driven LED chips, and one phosphor material. The aforementioned apparatus is expected to achieve the applications of an AC-driven white LED apparatus having the properties of a high color rendering, a high light emitting efficiency and a stable chromaticity coordinate.

(2) The LED apparatus is composed of one group of AlInGaN-based LED chips, at least one group of InGaPN-based LED chips, and at least one phosphor material. The aforementioned apparatus is expected to achieve the applications of an AC-driven white LED apparatus having the properties of a stable chromaticity coordinate.

To make it easier for our examiner to fully understand the technical characteristics and the effects of the present invention, we use preferred embodiments and related drawings for the detailed description of the present invention as follows:

DETAILED DESCRIPTION OF THE PREFERRED EMBODIMENTS

Figure 5:
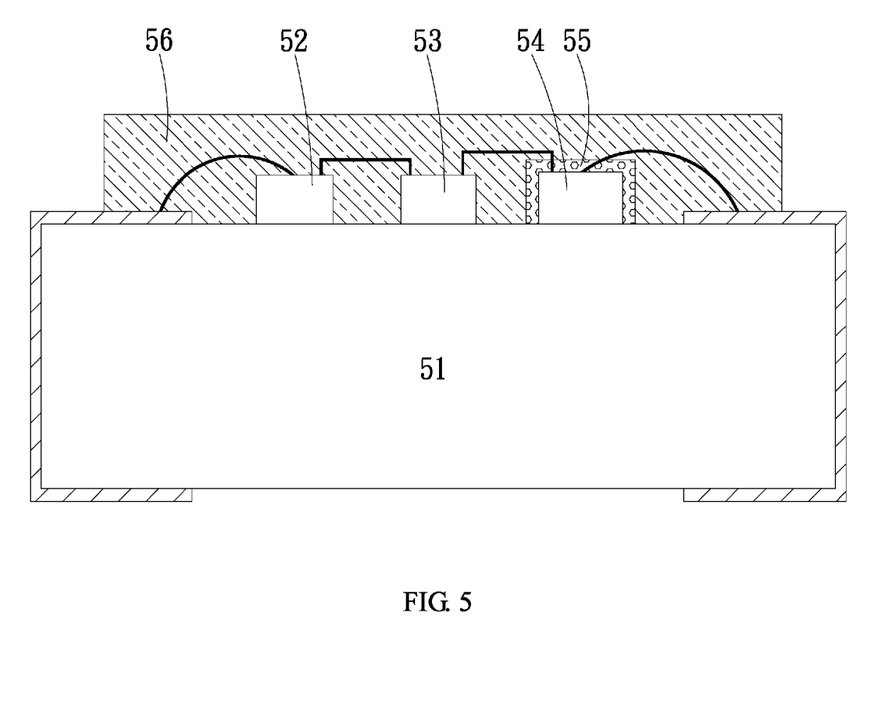
FIG. 5 is a schematic view showing the light emitting apparatus structure in accordance with the present invention.

With reference to FIG. 5 for a schematic view of a LED apparatus structure in accordance with the present invention, The LED apparatus comprises a lead frame 51, a first group of the LED chips 52, a second group of the LED chips 53, and a third group of the LED chips 54, at least one wavelength conversion phosphor material 55, and one encapsulated resin 56. The wavelength conversion phosphor material 55 is mixed with the encapsulated resin 56, and the mixed resin is covered onto the first, second, and third groups of the LED chips 52, 53, 54. The wavelength conversion phosphor material 55 can convert into another radiation emission with a different wavelength by absorbing a part of the radiation emission from the third group of the LED chips 54. The encapsulated resin also has the function of protecting all the LED groups. The first group of the LED chips 52 is formed by the DC-driven AlInGaN-based LEDs, and the individual LED chip of the first group is connected by a bridge for providing an electric connection.

For example, if an AC-driven positive or negative half wave period is applied to the LED apparatus, the first group of the LED chips 52 can emit a peak wavelength ranging from 510 to 530 nm. However, the second group of the LED chips 53 is formed by the DC-driven InGaPN-based LEDs, and the individual LED chip of the second group is also connected by a bridge for providing an electric connection. If an AC-driven positive or negative half wave period is applied to the LED apparatus, the second group of the LED chips 53 can emit a peak wavelength ranging from 610 to 630 nm. Moreover, the third group of the LED chips 54 is formed by a cascade of a plurality of AlInGaN-based micro-LED chips and constitutes a conventional AC-driven LED chip. As an AC-driven positive or negative half wave period is applied to the third group of the LED chip 54, it can emit a peak wavelength ranging from 430 to 460 nm.

Furthermore, the wavelength conversion phosphor material 55 is selected from one of $Sr_{1-x-y}Ba_xCa_ySiO_4:Eu^{2+}$ F, $(Sr_{1-x-y}Eu_xMn_y)P_{2+z}O_7:Eu^{2+}$ F, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8.2SrCl_2$:Eu, BAM:Eu, Sr-Aluminate:Eu, Thiogallate:Eu, Chlorosilicate:Eu, Borate:Ce,Tb, $Sr_4Al_{14}O_{25}$:Eu, $YBO_3$:Ce, Tb, $BaMgAl_{10}O_{17}$:Eu,Mn, $(Sr,Ca,Ba)(Al,Ga)_2S_4$:Eu, $Ca_2MgSi_2O_7$:Cl,Eu,Mn, $(Sr,Ca,Ba,Mg)_{10}(PO_4)_6Cl_2$:Eu, ZnS:Cu,Al, $(Y,Gd,Tb,Lu,Yb)(Al_yGa_{1-y})_5O_{12}$:Ce, $(Sr_{1-x-y-z}Ba_xCa_yEu_z)_2SiO_4$, $(Sr_{1-a-b}Ca_bBa_c)Si_xN_yO_z:Eu_a$, $Sr_5(PO_4)_3Cl:Eu_a$, and a mixture of any combination of the above, and it converts into a peak wavelength ranging from 550 to 590 nm by absorbing a part of the radiation emission from the third group of the LED chips 54. The LED apparatus can be directly driven by an AC power source by providing a circuit and a conductive wire to electrically connect the first group of the LED chips 52, the second group of the LED chips 53, and the third group of the LED chips 54. By combining the spectral regions of 430~460 nm, 510~530 nm, 550~590 nm, and 610~630 nm, the AC-driven white LED apparatus can achieve the properties of high color rendering, high light emitting efficiency and stable chromaticity coordinate. The lead frame 51 of the present invention is selected from one of ceramic based material, aluminum nitride based (AlN-based) material, copper, aluminum, molybdenum, tungsten, and aluminum oxide based (AlO-based) material or mixture of any combination of the above.

Figure 6:
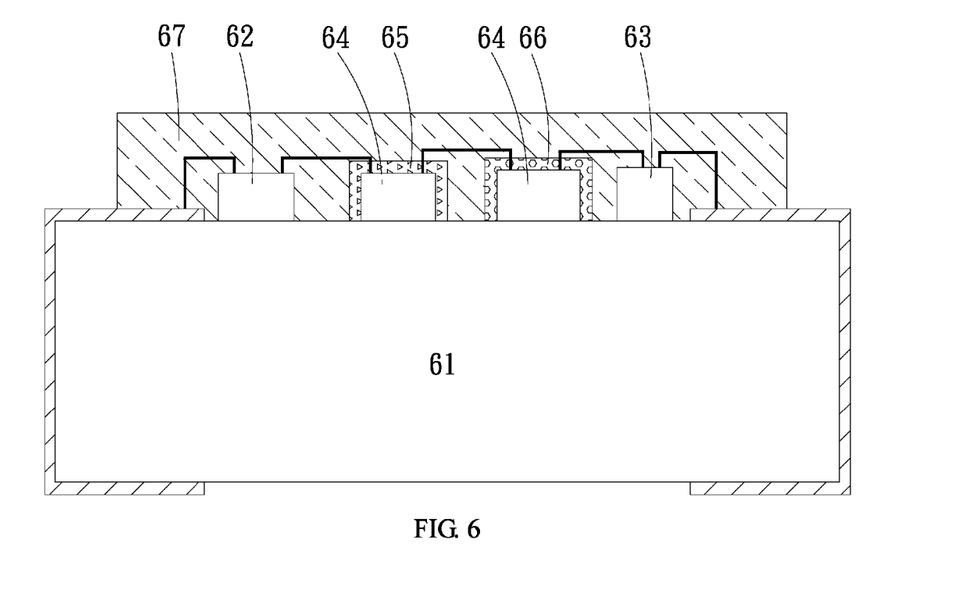
FIG. 6 is a schematic view showing another light emitting apparatus structure in accordance with the present invention.

With reference to FIG. 6 for a schematic view of another LED apparatus structure of the present invention, The LED apparatus comprises a lead frame 61, a first group of the LED chips 62, a second group of the LED chips 63, and a third group of the LED chips 64, a first phosphor material 65, a second phosphor material 66, and one encapsulated resin 67.

The wavelength conversion phosphor materials 65, 66 are mixed with the encapsulated resin 67, and the mixed resin is covered onto the first, second, and third groups of the LED chips 62, 63, 64. Wherein the first group of the LED chips 62 is formed by the DC-driven AlInGaN-based LEDs, and the individual LED chip of the first group is connected by a bridge for providing an electric connection. If an AC-driven positive or negative half wave period is applied to the LED apparatus, the first group of the LED chips 62 can emit a green spectral region with a peak wavelength ranging from 510 to 530 nm. However, the second group of the LED chips 63 is formed by the DC-driven InGaPN-based LEDs, and the individual LED chip of the second group is also connected by a bridge for providing an electric connection. If an AC-driven positive or negative half wave period is applied to the LED apparatus, the second group of the LED chips 63 can emit a red spectral region with a peak wavelength ranging from 610 to 630 nm. Moreover, the third group of the LED chips 64 is formed by cascading a plurality of AlInGaN-based micro-LED chips and constitutes a conventional AC-driven LED chip. As an AC-driven positive or negative half wave period is applied to the third group of the LED chips 64, it can emit a blue spectral region with a peak wavelength ranging from 430 to 460 nm. To further improve the stability of the chromaticity coordinates, a pair of individually separated AC-driven LED chips are provided as the load for the AC power supply and a conductive wire electrically connects the two chips. According to the application of present invention, it is preferable to select the loading voltage of an individual AC-driven LED chip ranges from 75 to 150 volts.

Furthermore, the first phosphor material 65 is selected from one of $Sr_{1-x-y}Ba_xCa_ySiO_4:Eu^{2+}F$, $(Sr_{1-x-y}Eu_xMn_y)P_{2+z}O_7:Eu^{2+}F$, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8.2SrCl_2:Eu$, BAM:Eu, Sr-Aluminate:Eu, Thiogallate:Eu, Chlorosilicate:Eu, Borate:Ce,Tb, $Sr_4Al_{14}O_{25}:Eu$, $YBO_3:Ce,Tb$, $BaMgAl_{10}O_{17}:Eu,Mn$, $(Sr,Ca,Ba)(Al,Ga)_2S_4:Eu$, $Ca_2MgSi_2O_7:Cl,Eu,Mn$, $(Sr,Ca,Ba,Mg)_{10}(PO_4)_6Cl_2:Eu$, ZnS:Cu,Al, $(Y,Gd,Tb,Lu,Yb)(Al_yGa_{1-y})_5O_{12}:Ce$, $(Sr_{1-x-y-z}Ba_xCa_yEu_z)_2SiO_4$, $(Sr_{1-a-b}Ca_bBa_c)Si_xN_yO_z:Eu_a$, $Sr_5(PO_4)_3Cl:Eu_a$, and the combination of aforementioned phosphor materials. The first phosphor material 65 converts the light emitted by the third group of the LED chips 64 to have a yellow-green spectral region with a peak wavelength ranging from 550 to 590 nm by absorbing a part of the radiation emission therefrom.

The second phosphor material 66 is selected from one of $Sr_{1-x-y}Ba_xCa_ySiO_4:Eu^{2+}F$, $(Sr_{1-x-y}Eu_xMn_y)P_{2+z}O_7:Eu^{2+}F$, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8.2SrCl_2:Eu$, BAM:Eu, Sr-Aluminate:Eu, Thiogallate:Eu, Chlorosilicate:Eu, Borate:Ce,Tb, $Sr_4Al_{14}O_{25}:Eu$, $YBO_3:Ce,Tb$, $BaMgAl_{10}O_{17}:Eu,Mn$, $(Sr,Ca,Ba)(Al,Ga)_2S_4:Eu$, $Ca_2MgSi_2O_7:Cl,Eu,Mn$, $(Sr,Ca,Ba,Mg)_{10}(PO_4)_6Cl_2:Eu$, ZnS:Cu,Al, $(Y,Gd,Tb,Lu,Yb)(Al_yGa_{1-y})_5O_{12}:Ce$, $(Sr_{1-x-y-z}Ba_xCa_yEu_z)_2SiO_4$, $(Sr_{1-a-b}Ca_bBa_c)Si_xN_yO_z:Eu_a$, $Sr_5(PO_4)_3Cl:Eu_a$, and a mixture of any combination of the above. The second phosphor material 66 converts the light emitted by the third group of the LED chips 64 to have a red spectral region with a peak wavelength ranging from 630 to 650 nm by absorbing a part of the radiation emission therefrom. The LED apparatus can be directly driven by an AC power source by providing a circuit and a conductive wire to electrically connect the first group of the LED chips 62, the second group of the LED chips 63, and the third group of the LED chips 64. By combining the spectral regions of 430~460 nm, 510~530 nm, 550~590 nm, 610~630 nm, and 630~650 nm, the AC-driven white LED apparatus can achieve the properties of high color rendering, high light emitting efficiency and stable chromaticity coordinate. The lead frame 61 of the present invention is selected from one of ceramic based material, aluminum nitride based (AlN-based) material, copper, aluminum, molybdenum, tungsten, aluminum oxide based (AlO-based) material, and a mixture of any combination of the above.

Figure 7:
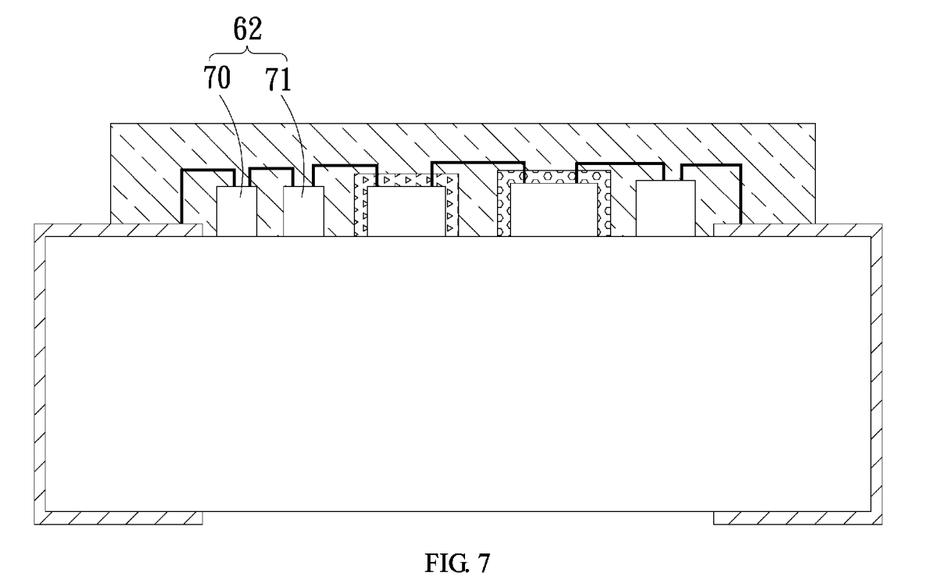
FIG. 7 is a schematic view showing another light emitting apparatus structure in accordance with the present invention.

With reference to FIG. 7 for a schematic view of another LED apparatus structure of the present invention, the LED apparatus of this embodiment is the same as the above embodiments. Only the first group of the LED chips 62 further includes another DC-driven group of LED chips with a different emission wavelength, the other elements are the same as in FIG. 6. For example, it is preferable to combine a fourth DC-driven group of the LED chips 70 with an emission wavelength ranging from 510 to 530 nm and a fifth DC-driven group of the LED chips 71 with an emission wavelength ranging from 460 to 510 nm.

Figure 8:
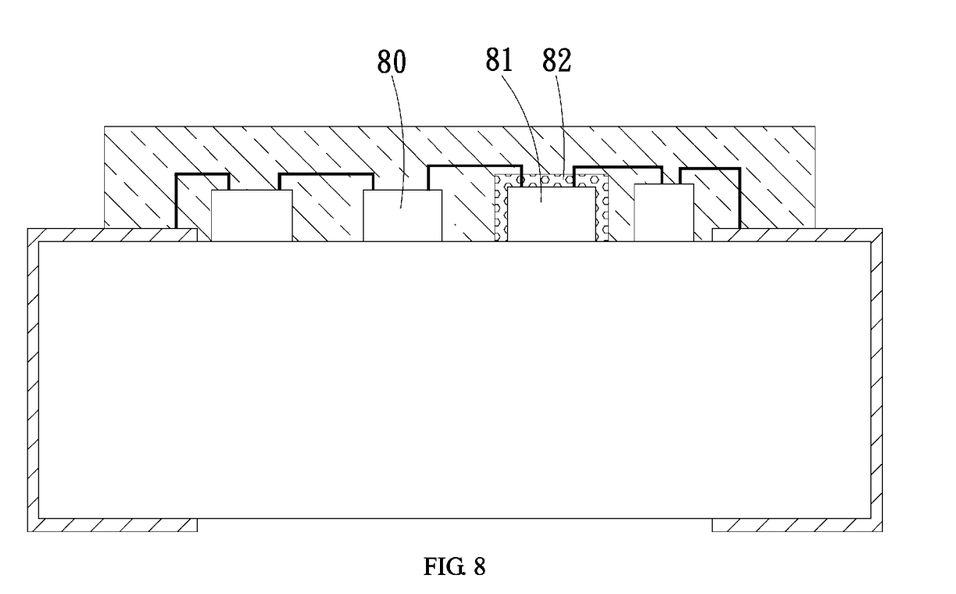
FIG. 8 is a schematic view showing a further light emitting apparatus structure in accordance with the present invention.

With reference to FIG. 8 for a schematic view of another LED apparatus structure of the present invention, the LED apparatus of this embodiment is the same as the above embodiments. Only the third group of the LED chips 64 further includes another AC-driven group of LED chips with a different emission wavelength, the other elements are the same as in FIG. 6. For example, it is preferable to combine a sixth AC-driven group of the LED chips 80 with an emission wavelength ranging from 510 to 530 nm and a seventh AC-driven group of the LED chips 81 with an emission wavelength ranging from 430 to 460 nm. However, the phosphor material 82 converts into a red spectral region with a peak wavelength ranging from 630 to 650 nm by absorbing a part of the radiation emission from the seventh group of the LED chips 81.

Figure 9A:
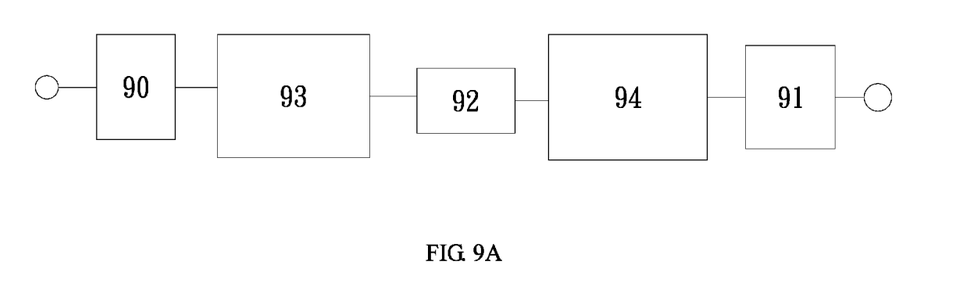
FIG. 9A~9C is a schematic view of an equivalent circuit in accordance with a preferred embodiment of the present invention.
Figure 9B:
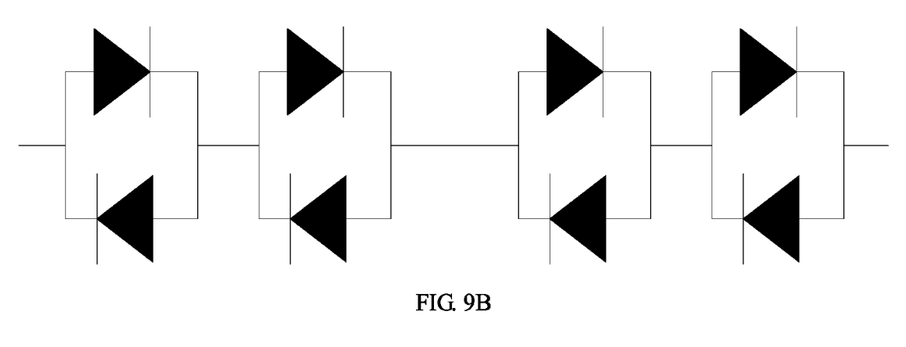
Figure 9C:
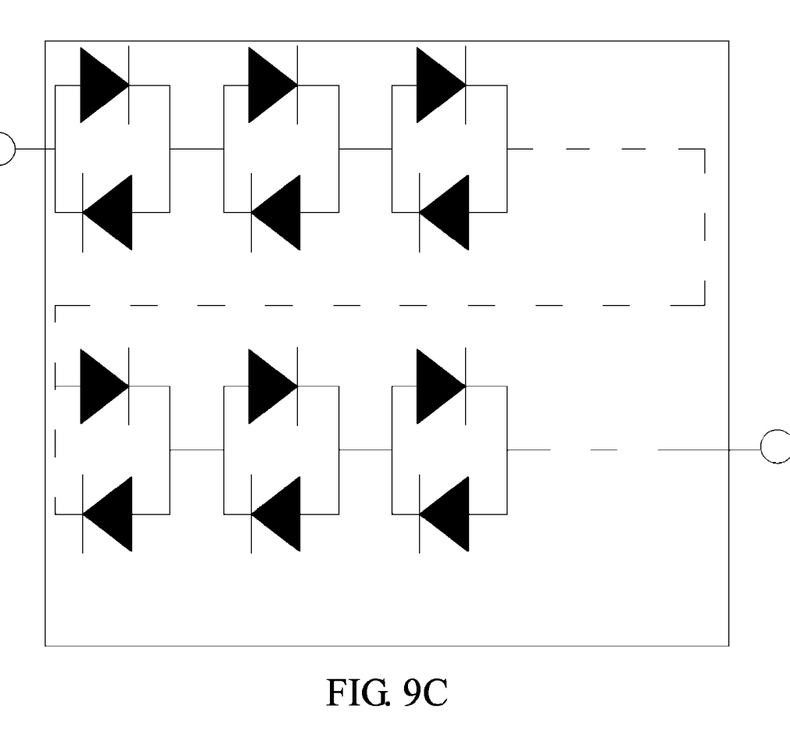

With reference to FIG. 9A for a schematic view of an equivalent circuit in accordance with a preferred embodiment of the present invention, the equivalent circuit includes two groups of DC-driven green-LED chips 90 and 91, a group of DC-driven red-LED chips 92, and two groups of AC-driven blue-LED chips 93 and 94. The chips in the groups of 90, 91, and 92 are connected each other with an opposite polarity by the electrodes of two individual chips, as shown in FIG. 9B. However, the manufacturing method of the groups of AC-driven blue-LED chips 93 and 94 is to form a plurality of micro-LED chips on an insulating substrate and cascade the micro-LED chips by a conductive wire, as shown in FIG. 9C. If an AC-driven positive half wave period is applied to the LED apparatus, the current flows sequentially from the group 90 to 93, 94, and 91. However, if an AC-driven negative positive half wave period is applied to the LED apparatus, the current flows sequentially from the group 91 to 94, 93, and 90.

Figure 10:
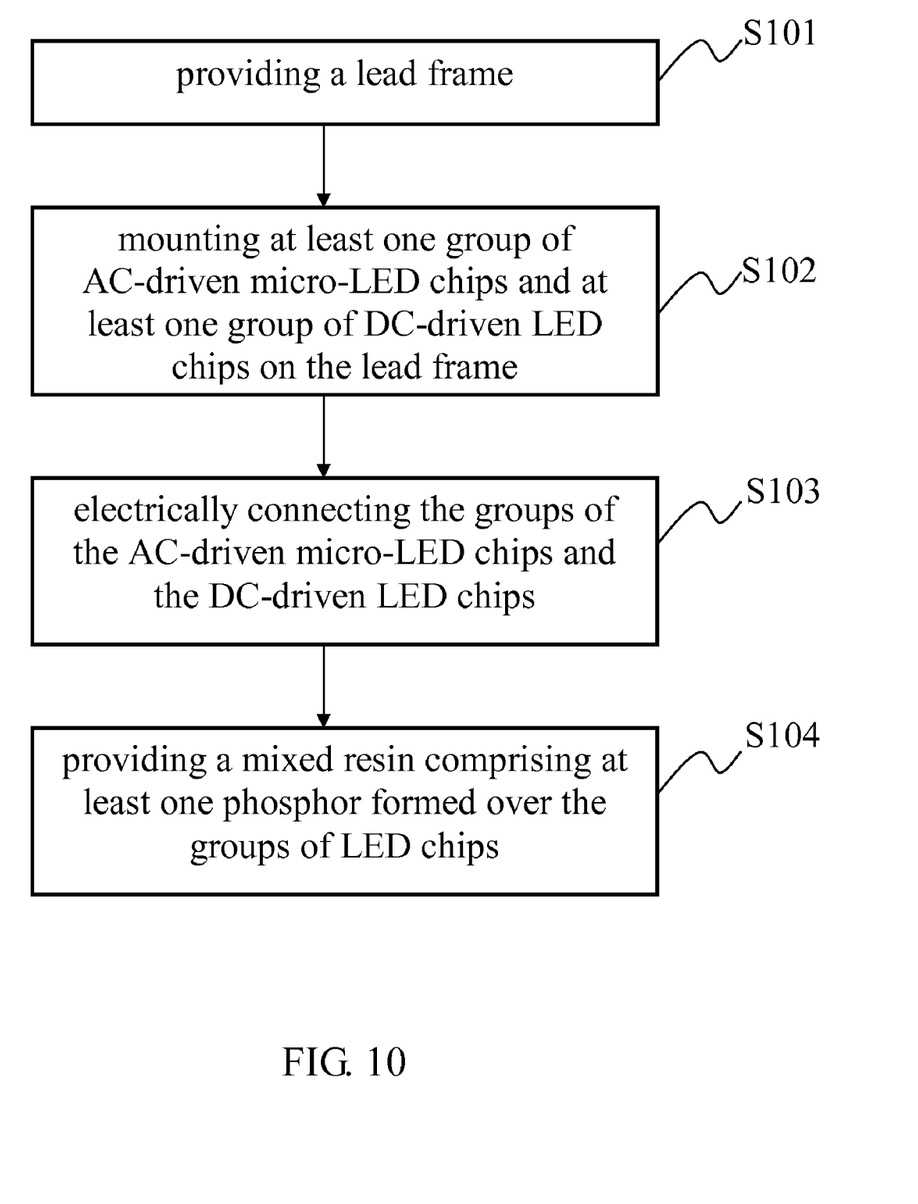
FIG. 10 is a manufacturing flow chart showing a preferred embodiment of the LED apparatus manufacturing method in accordance with the present invention.

With reference to FIG. 10, which illustrates the manufacturing flow chart of the LED apparatus manufacturing method of one of the preferred embodiment of the present invention, which includes the following steps:

S101: providing a lead frame;

S102: mounting at least one group of AC-driven micro-LED chips and at least one group of DC-driven LED chips on the lead frame;

S103: electrically connecting the groups of the AC-driven micro-LED chips and the DC-driven LED chips; and S104: providing a mixed resin comprising at least one phosphor formed over the groups of LED chips.

In one embodiment, the group of AC-driven micro-LED chips may be composed of AlInGaN-based compound semiconductors, and an active region of the AC-driven micro-LED chips is composed of AlInGaN and InGaN. Furthermore, the group of DC-driven LED chips may be composed of InGaPN-based compound semiconductors, and an active region of the DC-driven LED chips is composed of InGaPN and AlGaP. The method may further comprise a step of electrically connecting the individual micro-LED chip by a cascading method, and a step of electrically connecting the individual DC-driven LED chip by a bridge method. In addition, the wavelength conversion phosphor may be made of a material selected from a group consisting of $Sr_{1-x-y}Ba_xCa_ySiO_4$:$Eu^{2+}$,F, $(Sr_{1-x-y}Eu_xMn_y)P_2+zO_7$:$Eu^{2+}$,F, $(Ba,Sr,Ca)Al_2O_4$:Eu, $((Ba,Sr,Ca)(Mg,Zn))Si_2O_7$:Eu, $SrGa_2S_4$:Eu, $((Ba,Sr,Ca)_{1-x}Eu_x)(Mg,Zn)_{1-x}Mn_x))Al_{10}O_{17}$, $Ca_8Mg(SiO_4)_4Cl_2$:Eu,Mn, $((Ba,Sr,Ca,Mg)_{1-x}Eu_x)_2SiO_4$, $Ca_2MgSi_2O_7$:Cl, $SrSi_3O_8 \cdot 2SrCl_2$:Eu, BAM:Eu, Sr-Aluminate:Eu, Thiogallate:Eu, Chlorosilicate:Eu, Borate:Ce,Tb, $Sr_4Al_{14}O_{25}$:Eu, $YBO_3$:Ce,Tb, $BaMgAl_{10}O_{17}$:Eu,Mn, $(Sr,Ca,Ba)(Al,Ga)_2S_4$:Eu, $Ca_2MgSi_2O_7$:Cl,Eu,Mn, $(Sr,Ca,Ba,Mg)_{10}(PO_4)_6Cl_2$:Eu, ZnS:Cu,Al, $(Y,Gd,Tb,Lu,Yb)(Al_yGa_{1-y})_5O_{12}$:Ce, $(Sr_{1-x-y-z}Ba_xCa_yEu_z)_2SiO_4$, $(Sr_{1-a-b}Ca_bBa_c)Si_xN_yO_z$:$Eu_a$ and $Sr_5(PO_4)_3Cl$:$Eu_a$ or a mixture of any combination thereof.

As the disclosure of the LED apparatus in the present invention, it achieves an AC-driven white LED apparatus with a stable chromaticity coordinate and improves the color rendering and the light emitting efficiency by comprising a group of AC-driven LED chips, a group of DC-driven LED chips, and a wavelength conversion phosphor material. In addition, the LED apparatus of the present invention achieves an AC-driven white LED apparatus with a stable chromaticity coordinate by comprising a group of the AlInGaN-based LED chips, a group of the InGaPN-based LED chips, and a wavelength conversion phosphor material.

The present invention improves over the prior art and complies with the patent application requirements, and thus is duly filed for patent applications.

While the invention has been described by means of specific embodiments, numerous modifications and variations could be made thereto by those skilled in the art without departing from the scope and spirit of the invention set forth in the claims.

What is claimed is:

1. An LED apparatus, comprising a lead frame; at least one group of AC-driven micro-LED chips; at least one group of DC-driven LED chips; and at least one wavelength conversion phosphor material for absorbing radiation emission of the chips; wherein the group of the AC-driven micro-LED chips and the group of DC-driven LED chips are individually mounted onto the lead frame and connected by a conductive wire to form the LED apparatus capable of being driven by an AC power source, the wavelength conversion phosphor material absorbs a part of the radiation emission of the chips thereby converting a spectral region thereof to have a different peak wavelength
    wherein the group of DC-driven LED chips is composed of AlInGaN-based and InGaPN-based compound semiconductors.

2. The LED apparatus as set forth in claim 1, wherein the group of AC-driven micro-LED chips is composed of AlInGaN-based compound semiconductors.

3. The LED apparatus as set forth in claim 1, wherein the group of AC-driven micro-LED chips is composed of a plurality of AlInGaN-based micro-LED chips which are formed on an insulating substrate.

4. The LED apparatus as set forth in claim 1, wherein an active region of the AlInGaN-based compound semiconductor is composed of AlInGaN and InGaN.

5. The LED apparatus as set forth in claim 1, wherein an active region of the InGaPN-based compound semiconductor is composed of InGaPN and AlGaP.

6. The LED apparatus as set forth in claim 1, wherein the wavelength conversion phosphor material is made of a material selected from a group consisting of $Sr_{1-x-y}Ba_xCa_ySiO_4$:$Eu^{2+}$,F, $(Sr_{1-x-y}Eu_xMn_y)P_2+zO_7$:$Eu^{2+}$,F, $(Ba,Sr,Ca)Al_2O_4$:Eu, $((Ba,Sr,Ca)(Mg,Zn))Si_2O_7$:Eu, $SrGa_2S_4$:Eu, $((Ba,Sr,Ca)_{1-x}Eu_x)(Mg,Zn)_{1-x}Mn_x))Al_{10}O_{17}$, $Ca_8Mg(SiO_4)_4Cl_2$:Eu,Mn, $((Ba,Sr,Ca,Mg)_{1-x}Eu_x)_2SiO_4$, $Ca_2MgSi_2O_7$:Cl, $SrSi_3O_8 \cdot 2SrCl_2$:Eu, BAM:Eu, Sr-Aluminate:Eu, Thiogallate:Eu, Chlorosilicate:Eu, Borate:Ce,Tb, $Sr_4Al_{14w80}O_{25}$:Eu, $YBO_3$:Ce,Tb, $BaMgAl_{10}O_{17}$:Eu,Mn, $(Sr,Ca,Ba)(Al,Ga)_2S_4$:Eu, $Ca_2MgSi_2O_7$:Cl,Eu,Mn, $(Sr,Ca,Ba,Mg)_{10}(PO_4)_6Cl_2$:Eu, ZnS:Cu,Al, $(Y,Gd,Tb,Lu,Yb)(Al_yGa_{1-y})_5O_{12}$:Ce, $(Sr_{1-x-y-z}Ba_xCa_yEu_z)_2SiO_4$, $(Sr_{1-a-b}Ca_bBa_c)Si_xN_yO_z$:$Eu_a$ and $Sr_5(PO_4)_3Cl$:$Eu_a$ or a mixture of any combination thereof.

7. An LED apparatus, comprising a lead frame; at least one group of AlInGaN-based LED chips; at least one group of InGaPN-based LED chips; and at least one wavelength conversion phosphor material disposing on the at least one group of AlInGaN-based LED chips for absorbing radiation emission therefrom; wherein the group of the AlInGaN-based LED chips and the group of the InGaPN-based LED chips are individually mounted onto the lead frame and connected by a conductive wire to form the LED apparatus capable of being driven by an AC power source, the wavelength conversion phosphor material absorbs a part of the radiation emission from the groups of the AlInGaN-based LED chips thereby converting a spectral region thereof to have a different peak wavelength,
    wherein the group of InGaPN-based LED chips is an AC-driven LED chips formed by connecting a plurality of InGaPN-based LED chips by a bridge connection.

8. The LED apparatus as set forth in claim 7, wherein an active region of the group of AlInGaN-based LED chips is composed of AlInGaN and InGaN.

9. The LED apparatus as set forth in claim 7, wherein an active region of the group of InGaPN-based LED chips is composed of InGaPN and AlGaP.

10. The LED apparatus as set forth in claim 7, wherein the wavelength conversion phosphor material is made of a material selected from a group consisting of $Sr_{1-x-y}Ba_xCa_ySiO_4$:$Eu^{2+}$,F, $(Sr_{1-x-y}Eu_xMn_y)P_2+zO_7$:$Eu^{2+}$,F, $(Ba,Sr,Ca)Al_2O_4$:Eu, $((Ba,Sr,Ca)(Mg,Zn))Si_2O_7$:Eu, $SrGa_2S_4$:Eu, $((Ba,Sr,Ca)_{1-x}Eu_x)(Mg,Zn)_{1-x}Mn_x))Al_{10}O_{17}$, $Ca_8Mg(SiO_4)_4Cl_2$:Eu,Mn, $((Ba,Sr,Ca,Mg)_{1-x}Eu_x)_2SiO_4$, $Ca_2MgSi_2O_7$:Cl, $SrSi_3O_8 \cdot 2SrCl_2$:Eu, BAM:Eu, Sr-Aluminate:Eu, Thiogallate:Eu, Chlorosilicate:Eu, Borate:Ce,Tb, $Sr_4Al_{14}O_{25}$:Eu, $YBO_3$:Ce,Tb, $BaMgAl_{10}O_{17}$:Eu,Mn, $(Sr,Ca,Ba)(Al,Ga)_2S_4$:Eu, $Ca_2MgSi_2O_7$:Cl,Eu,Mn, $(Sr,Ca,Ba,Mg)_{10}(PO_4)_6Cl_2$:Eu, ZnS:Cu,Al, $(Y,Gd,Tb,Lu,Yb)(Al_yGa_{1-y})_5O_{12}$:Ce, $(Sr_{1-x-y-z}Ba_xCa_yEu_z)_2SiO_4$, $(Sr_{1-a-b}Ca_aBa_c)Si_xN_yO_z:Eu_a$ and $Sr_5(PO_4)_3Cl:Eu_a$ or a mixture of any combination thereof.

11. An LED apparatus manufacturing method, comprising the steps of: providing a lead frame; mounting at least one group of AC-driven micro-LED chips and at least one group of DC-driven LED chips on the lead frame; electrically connecting the groups of the AC-driven micro-LED chips and the DC-driven LED chips; and providing a mixed resin comprising at least one wavelength conversion phosphor material formed over the groups of LED chips, wherein the group of DC-driven LED chips is composed of InGaPN-based compound semiconductors.

12. The LED apparatus manufacturing method as set forth in claim 11, wherein the group of AC-driven micro-LED chips is composed of AlInGaN-based compound semiconductors.

13. The LED apparatus manufacturing method as set forth in claim 12, wherein an active region of the AC-driven micro-LED chips is composed of AlInGaN and InGaN.

14. The LED apparatus manufacturing method as set forth in claim 11, wherein an active region of the DC-driven LED chips is composed of InGaPN and AlGaP.

15. The LED apparatus manufacturing method as set forth in claim 11, further comprising a step of electrically connecting the individual AC-driven micro-LED chips by a cascading method.

16. The LED apparatus manufacturing method as set forth in claim 15, further comprising a step of electrically connecting the individual DC-driven LED chips by a bridge method.

17. The LED apparatus manufacturing method as set forth in claim 11, wherein the wavelength conversion phosphor material is made of a material selected from a group consisting of $Sr_{1-x-y}Ba_xCa_ySiO_4:Eu^{2+}F$, $(Sr_{1-x-y}Eu_xMn_y)P_{2+z}O_7:Eu^{2-}FF$, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8·2SrCl_2:Eu$, BAM:Eu, Sr-Aluminate:Eu, Thiogallate:Eu, Chlorosilicate:Eu, Borate:Ce,Tb, $Sr_4Al_{14}O_{25}:Eu$, $YBO_3:Ce,Tb$, $BaMgAl_{10}O_{17}:Eu,Mn$, $(Sr,Ca,Ba)(Al,Ga)_2S_4:Eu$, $Ca_2MgSi_2O_7:Cl,Eu,Mn$, $(Sr,Ca,Ba,Mg)_{10}(PO4)_6Cl_2:Eu$, $ZnS:Cu,Al$, $(Y,Gd,Tb,Lu,Yb)(Al_yGa_{1-y})_5O_{12}:Ce$, $(Sr_{1-x-y-z}Ba_xCa_yEu_z)_2SiO_4$, $(Sr_{1-a-b}Ca_aBa_c)Si_xN_yO_z:Eu_a$ and $Sr_5(PO_4)_3Cl:Eu_a$ or a mixture of any combination thereof.

* * * * *